US010615353B2

(12) United States Patent
Liang et al.

(10) Patent No.: US 10,615,353 B2
(45) Date of Patent: *Apr. 7, 2020

(54) MANUFACTURING METHOD OF ORGANIC THIN FILM TRANSISTOR

(71) Applicant: Wuhan China Star Optoelectronics Technology Co., Ltd., Wuhan, Hubei (CN)

(72) Inventors: Bo Liang, Guangdong (CN); Wei Wang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/254,711

(22) Filed: Jan. 23, 2019

(65) Prior Publication Data
US 2019/0157592 A1    May 23, 2019

Related U.S. Application Data

(62) Division of application No. 15/544,015, filed on Jul. 16, 2017, now Pat. No. 10,319,925.

(51) Int. Cl.
*H01L 51/05*    (2006.01)
*H01L 51/00*    (2006.01)
*H01L 27/32*    (2006.01)

(52) U.S. Cl.
CPC ...... *H01L 51/0558* (2013.01); *H01L 27/3274* (2013.01); *H01L 51/0013* (2013.01); *H01L 51/0045* (2013.01); *H01L 51/0052* (2013.01)

(58) Field of Classification Search
CPC ............ H01L 51/0558; H01L 27/3274; H01L 51/0013; H01L 51/0045; H01L 51/0052
(Continued)

(56) References Cited

U.S. PATENT DOCUMENTS

2011/0244661 A1* 10/2011 Dai ...................... B82Y 10/00
                                                                438/478

FOREIGN PATENT DOCUMENTS

CN    103345963 A    10/2013
CN    103943778 A     7/2014
(Continued)

OTHER PUBLICATIONS

CN2017102450035_1st Office Action.
PCTCN2017082630_PCT_International Search Report.

*Primary Examiner* — Bo Fan
(74) *Attorney, Agent, or Firm* — Andrew C. Cheng

(57) ABSTRACT

A method for manufacturing an organic thin film transistor includes steps of: forming a graphene layer on a surface of a metal substrate; covering a surface of the graphene layer with an organic solution and heating the graphene layer to form organic semiconductor nano lines on the surface of the graphene layer; and transferring the organic semiconductor nano lines to a target substrate. The graphene layer is formed on the surface of the metal substrate in mass production. The organic semiconductor nano lines (monocrystalline semiconductor) are grown in mass production by the graphene layer. The semiconductor layer having organic thin film transistors is formed after transferring the organic semiconductor nano lines on the target substrate. A large amount of the organic semiconductor nano lines can be formed simultaneously on the surface of the metal substrate with a large area.

5 Claims, 4 Drawing Sheets

(58) Field of Classification Search
USPC .......................................................... 438/99
See application file for complete search history.

(56) References Cited

FOREIGN PATENT DOCUMENTS

| | | |
|---|---|---|
| CN | 104584252 A | 4/2015 |
| CN | 104701455 A | 6/2015 |
| CN | 105247697 A | 1/2016 |
| CN | 105304729 A | 2/2016 |
| CN | 205069659 U | 3/2016 |
| CN | 105551909 A | 5/2016 |
| CN | 105576123 A | 5/2016 |

* cited by examiner

MANUFACTURING METHOD OF ORGANIC THIN FILM TRANSISTOR

CROSS REFERENCE

This is a divisional application of co-pending U.S. patent application Ser. No. 14/544,015, filed on Jul. 16, 2017, which is a national stage of foreign priority of PCT Application No. PCT/CN2017/082630, filed on Apr. 28, 2017, claiming foreign priority of Chinese Patent Application No. 201710245003.5, entitled "Manufacturing method of organic thin film transistor", filed on Apr. 14, 2017, the disclosure of which is incorporated herein by reference in its entirety.

FIELD OF THE INVENTION

The present application relates to a display technology field, and more particularly to a manufacturing method of an organic thin film transistor.

BACKGROUND OF THE INVENTION

With the continuous progress of display technology, the flexible display device gradually appears in the market and the novel appearance of the flexible display device has a great attraction to the user. The Thin Film Transistors (TFT) are located on the array substrate of the flexible display device and are important elements of controlling the work of the Organic Light Emitting Diodes (OLED). The Organic Thin Film Transistors (OTFT) are thin film transistors made of organic material. In comparison with the flexible OLED display device based on Low Temperature Poly-silicon (LTPS) TFT or Indium Gallium Zinc Oxide (IGZO) TFT, the flexible OLED display device based on OTFT utilizes organic material, of which the flexibility is much higher than that of inorganic material (silicon semiconductor or metal oxide semiconductor). No fracture after many times of bending appears to significantly promote the ability of the flexible display device to withstand bending. Accordingly, the OTFT with the good bending property can replace the inorganic TFT in the flexible display field.

In prior art, the fabrication of OTFT utilizes vacuum deposition or solution treatment. The consumed time of manufacture process is longer and the production scale is small. The fabrication of OTFT is limited by the production process and equipment, resulting in the inability to carry out large-scale production to lead to the low production capacity of the display devices and the increase in the production cost.

SUMMARY OF THE INVENTION

On this account, the technical issue to be solved by the present application is to provide a manufacturing method of an organic thin film transistor to solve the issue that the fabrication of OTFT in prior art is limited by the production process and equipment, resulting in the inability to carry out large-scale production to lead to the low production capacity of the display devices and the increase in the production cost.

The manufacturing method of the organic thin film transistor comprises steps of:

forming a graphene layer on a surface of a metal substrate;

covering a surface of the graphene layer with organic solution and heating the graphene layer to form an organic semiconductor nano line on the surface of the graphene layer; and transferring the organic semiconductor nano line on a target substrate.

A plurality of organic semiconductor nano lines form an organic semiconductor nano line set in a transfer printing manner as transferring the organic semiconductor nano line.

The transfer printing manner is a roll-to-roll transfer printing or a roll-to-sheet transfer printing.

The step of forming the graphene layer on the surface of the metal substrate comprises: depositing methane gas and hydrogen by chemical vapor deposition on the surface of the metal substrate at an ambient temperature of not lower than 1000 Celsius degrees, wherein the metal substrate is a copper substrate.

A plurality of organic semiconductor nano lines form an organic semiconductor nano line set in a transfer printing manner as transferring the organic semiconductor nano line.

The transfer printing manner is a roll-to-roll transfer printing or a roll-to-sheet transfer printing.

The organic solution is a mixed solution of 9,10-bis-phenylethynylanthracene and dimethylformamide.

A plurality of organic semiconductor nano lines form an organic semiconductor nano line set in a transfer printing manner as transferring the organic semiconductor nano line.

The transfer printing manner is a roll-to-roll transfer printing or a roll-to-sheet transfer printing.

A concentration of 9,10-bis-phenylethynylanthracene in the organic solution is 0.004 mol/liter to 0.012 mol/liter.

A plurality of organic semiconductor nano lines form an organic semiconductor nano line set in a transfer printing manner as transferring the organic semiconductor nano line.

The transfer printing manner is a roll-to-roll transfer printing or a roll-to-sheet transfer printing.

A temperature of heating the graphene layer is not higher than 50 Celsius degrees and a heating time is not less than 48 hours.

A plurality of organic semiconductor nano lines form an organic semiconductor nano line set in a transfer printing manner as transferring the organic semiconductor nano line.

The transfer printing manner is a roll-to-roll transfer printing or a roll-to-sheet transfer printing.

The target substrate comprises a gate electrode, a gate insulation layer, a source and a drain, which are sequentially formed and stacked.

After the step of transferring the organic semiconductor nano line on the target substrate, the method further comprises a step of etching the organic semiconductor nano line to form a semiconductor channel.

The target substrate comprises a gate electrode and a gate insulation layer, which are sequentially stacked; and after the step of transferring the organic semiconductor nano line on the target substrate, the method further comprises a step of forming a source and a drain on a side of the organic semiconductor nano line away from the gate insulation layer.

After the step of transferring the organic semiconductor nano line on the target substrate, the method further comprises a step of etching the organic semiconductor nano line to form a semiconductor channel.

The benefits of the present application are: the graphene layer is formed on the surface of the metal substrate in mass production. The organic semiconductor nano lines (monocrystalline semiconductor) are grown in mass production by graphene layer. The semiconductor layer having organic thin film transistors are formed after transferring the organic semiconductor nano lines on the target substrate. A large amount of the organic semiconductor nano lines can be formed at a time on the surface of the metal substrate with a large area. The transferring skills of roll-to-roll and roll-to-sheet are mutual and can transfer the organic semiconductor nano lines of the metal substrate on the target substrate in mass production rapidly and with high quality for reducing the consumed time of manufacture process and satisfying the requirement of mass production. The production capacity of display device is high and the production cost is reduced.

BRIEF DESCRIPTION OF THE DRAWINGS

In order to more clearly explain the technical solution in the embodiments of the present invention, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts obtained, should all be considered within the scope of protection of the present application.

Figure 1:
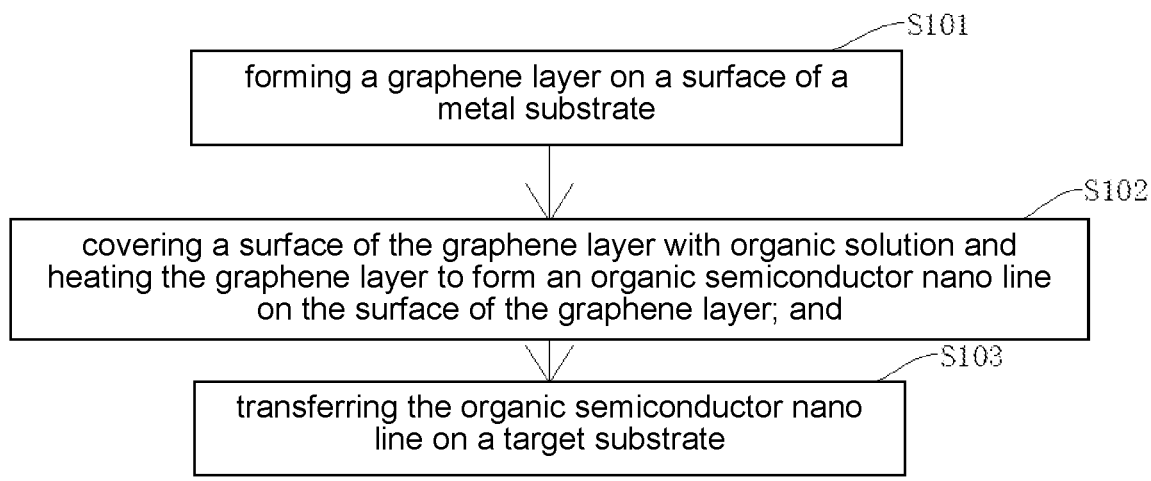
FIG. 1 is a flowchart of a manufacturing method of an organic thin film transistor provided by the embodiment of the present application.

FIG. 1 is a flowchart of a manufacturing method of an organic thin film transistor provided by the embodiment of the present application. As show in figure, the manufacturing method of the organic thin film transistor provided by the embodiment of the present application comprises steps of:

S101, forming a graphene layer 12 on a surface of a metal substrate 10.

In the present embodiment, the graphene layer 12 is formed on the surface of the metal substrate 10 by chemical vapor deposition. The Chemical Vapor Deposition (CVD) is a method of vapor deposition of material preparation, which introduces one or more compounds and monolithic gases constructing a thin film element into a reaction chamber, in which a substrate is placed and a solid film is deposited on the surface of the substrate by means of space gas chemical reaction. In this embodiment, the chemical vapor deposition is used. Two reaction gases are introduced into the reaction chamber to form the graphene layer 12 (graphene thin film) on the metal substrate 10 in the reaction chamber. Graphene is a honeycomb planar film formed by sp2 hybridization of carbon atoms, which is a quasi-two-dimensional material with only one atomic layer thickness, so also named monatomic layer graphene. Specifically, the metal substrate 10 is a substrate made of copper material. The chemical properties of the copper substrate are relatively stable. The copper substrate is not easy to react chemically with the reaction gas. The thermal conductivity of the copper substrate is good and the homogeneous graphene film can be formed in the high temperature reaction chamber. Furthermore, the gases used are methane gas (CH4) and hydrogen (H2) and the reaction chamber is set at a temperature of not lower than 1000 Celsius degrees. In one preferred embodiment, the reaction result is the best when the environment temperature in the reaction chamber is 1035 Celsius degrees. In this embodiment, the volume ratio of methane gas to hydrogen introduced into the reaction chamber is 2:1. Then, the effect of forming the graphene thin film on the copper substrate is the best.

Since the graphene layer 12 is formed on the surface of the metal substrate 10, the area of the graphene layer 12 depends on the size of the metal substrate 10 and the amount of the reaction gas introduced into the reaction chamber. Theoretically the area of the graphene layer 12 can be increased by increasing the size of the metal substrate 10 and increasing the amount of the reaction gas. The graphene layer 12 with a large area can provide a large amount of organic semiconductor nano lines 14 for the mass production of organic thin film transistors. The requirements of large-scale production can be met to improve production efficiency, to save production capacity and to reduce production cost.

S102, covering a surface of the graphene layer 12 with organic solution and heating the graphene layer 12 to form an organic semiconductor nano line 14 on the surface of the graphene layer 12.

Figure 2:
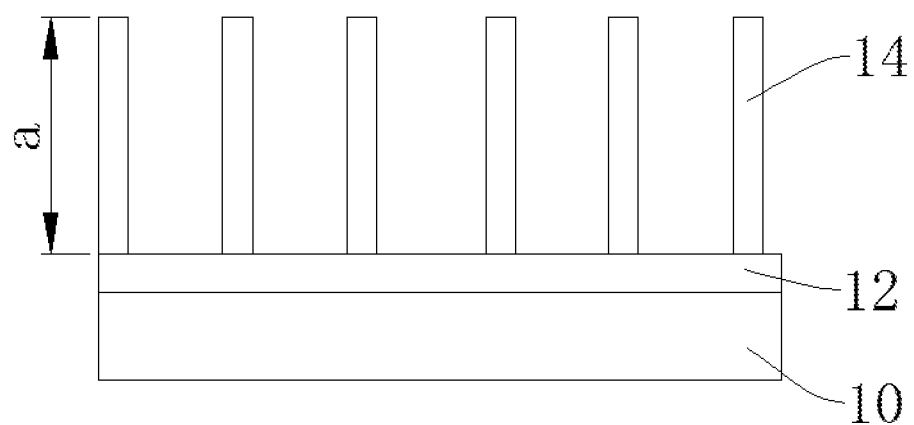
FIG. 2 is diagram of step S102 in a manufacturing method of an organic thin film transistor provided by the embodiment of the present application.

Please refer to FIG. 2. After the organic solution is uniformly dropped and coated on the surface of the graphene layer 12, the metal substrate 10 with the graphene layer 12 is placed in an oven and heated for a while and the solvent is evaporated. The organic semiconductor nano line 14, which is perpendicular with the metal substrate 10 is formed on the surface of the graphene layer 12. Furthermore, an amount of the organic semiconductor nano lines 14 is plural and the organic semiconductor nano lines are distributed on the surface of the graphene layer 12.

In this embodiment, the organic solution is a mixed solution of 9,10-bis-phenylethynylanthracene (BPEA) and dimethylformamide (DMF). The molecular formula of 9,10-bis-phenylethynylanthracene is C30H18 and the molecular formula of dimethylformamide is C3H7NO. Furthermore, in the organic solution, a concentration of the 9,10-bis-phenylethynylanthracene determines the length of the organic semiconductor nano line 14 grown on the metal substrate 10. Specifically, the concentration of the 9,10-bis-phenylethynylanthracene is 0.004 mol/L to 0.012 mol/L. The length a of the organic semiconductor nano line 14 obtained is 7 μm to 15 μm. The organic semiconductor nano lines 14 of various lengths can be obtained by adjusting the concentration of the 9,10-bis-phenylethynylanthracene in the organic solution. The organic thin film transistors of various specifications can be manufactured for satisfying the design demands of different display devices.

In this embodiment, a temperature of heating the graphene layer 12 is not higher than 50 Celsius degrees and a heating time is not less than 48 hours. Specifically, the heating temperature is set at 50 Celsius degrees and the heating time is set to 48 hours. The organic solution can be sufficiently evaporated to form a sufficient amount of the organic semiconductor nano line 14.

The metal substrate 10 of large size provides the graphene layer 12 with the large area. A large amount of organic semiconductor nano lines 14 can be formed with the graphene layer 12 with the large area for the mass production of organic thin film transistors to achieve the mass production. Specifically, the graphene layer 12 uses the metal substrate 10 to be the base and is formed on the surface of the metal substrate 10. Then, with increasing the size of the metal substrate 10, the area of the graphene layer 12 formed on the surface of the metal substrate 10 with one time chemical vapor deposition is larger. Thus, the amount of the organic semiconductor nano lines 14 formed on the graphene layer 12 is more. Namely, with increasing size of the metal substrate 10, the large amount of the organic semiconductor nano lines 14 can be formed with one step S101 and one step S102. After the organic semiconductor nano line 14 is transferred on a target substrate in a transfer printing manner and the organic thin film transistor is formed on the surface of the target substrate, the display panel with target size is obtained after cutting. More display panels can be obtained after cutting by increasing the size of the target substrate. More organic semiconductor nano lines 14 are required for the size increase of the target substrate. The metal substrate 10 of large size is correspondingly needed as transfer printing. Accordingly, more organic semiconductor nano lines 14 can be provided for the target substrate by increasing the size of the metal substrate 10. More display panels can be formed on one target substrate at the same time to production efficiency and are suitable for mass production.

S103, transferring the organic semiconductor nano line 14 on a target substrate 20.

Figure 3:
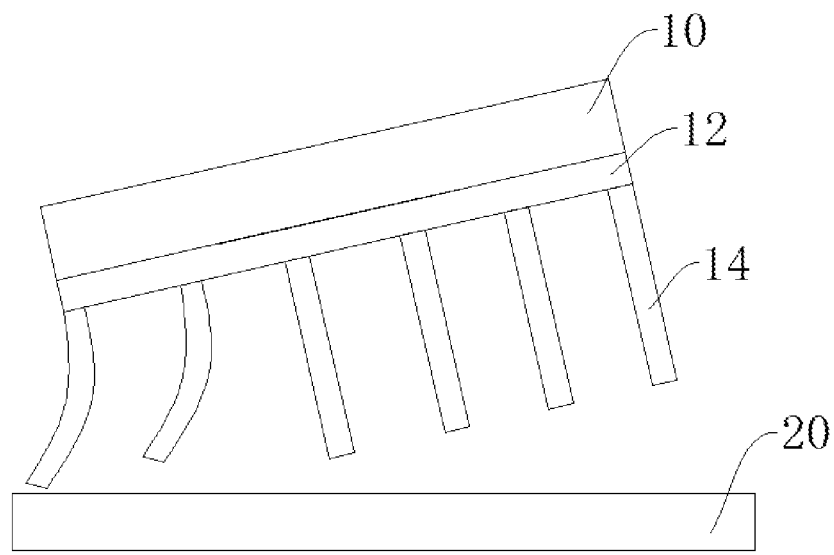
FIG. 3 is diagram of step S103 in a manufacturing method of an organic thin film transistor provided by the embodiment of the present application.

Please refer to FIG. 3 at the same time. In this embodiment, the organic semiconductor nano line 14 is transferred on the target substrate 20 in a transfer printing matter. The target substrate 20 is a display panel of composing a display panel. The transfer printing matter is a roll-to-roll transfer printing or a roll-to-sheet transfer printing. The roll-to-roll process is a high-performance, low-cost continuous production method. The object to be treated is a thin film with a flexible property. The material of the flexible board is plastic or a stainless steel sheet with a thickness less than 0.1 mm. After the flexible board is unwound from a cylindrical roll, a specific purpose function is added to the flexible board or the surface of the flexible board is processed. Then, the flexible board is rewound in a cylindrical, again or is directly cut to be an end product. The specific processes comprises Unwind, Process, Rewind and Cutting. The combination of the roll-to-roll processes on the surface of the flexible board comprises several major processes, such as Embossing, Laminate, Coating and Printing. In this embodiment, the target substrate 20 is the flexible board. The target substrate 20 is a main support element of a flexible display and elements such as a thin film transistor and an organic light emitter are configured on the target substrate 20. The target substrate 20 is processed after being unwound. The process is to transfer the organic semiconductor nano line 14 on the surface of the metal substrate 10 on the target substrate 20 in a press printing manner or a laminate manner. Specifically, the organic semiconductor nano line 14 faces the target substrate 20 and the metal substrate 10 is kept to be inclined to the target substrate 20. One end of the organic semiconductor nano line 14 away from the graphene layer 12 first contacts with the target substrate 20 and then the organic semiconductor nano line 14 is attached on the target substrate 20 from one end away from the graphene layer 12 to one end connected to the graphene layer 12 in the length direction. In this step, the large amount of the organic semiconductor nano line 14 perpendicular with the metal substrate 10 are rapidly tilted and transferred on the target substrate 20 to form the semiconductor layer 142 having organic thin film transistors for satisfying the requirement of mass production of organic thin film transistors.

Figure 4:
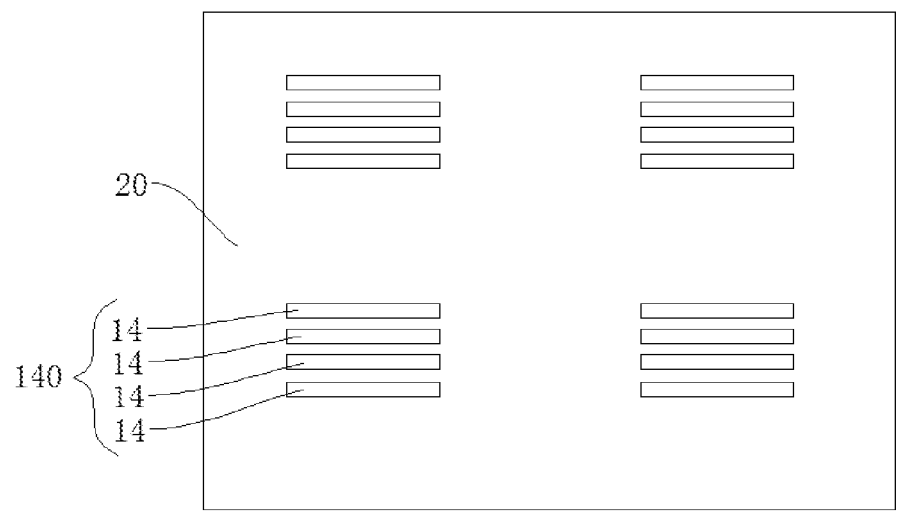
FIG. 4 is a top view diagram of a target substrate provided by the embodiment of the present application.

With combination of FIG. 4, the length direction of the organic semiconductor nano line 14 transferred on the target substrate 20 is parallel with the surface of the target substrate 20. Furthermore, a plurality of organic semiconductor nano lines 14 are transferred at the same time to form an organic semiconductor nano line set 140 as transferring the organic semiconductor nano line 14. Each organic semiconductor nano line set 140 corresponds to one pair of source 502 and drain 504. In this embodiment, each organic semiconductor nano line set 140 comprises four organic semiconductor nano lines 14, which are arranged in parallel. A plurality of organic semiconductor nano line sets 140 are arranged in array. Each organic semiconductor nano line set 140 corresponds to one pair of source 502 and drain 504. Namely, each organic semiconductor nano line set 140 correspondingly forms an organic thin film transistor. By changing the amount of the organic semiconductor nano lines 14 of each organic semiconductor nano line sets 140, various organic semiconductor layers 142 can be formed on the target substrate 20. The organic thin film transistors of various specifications can be manufactured to meet production need and to improve production efficiency.

Figure 5:
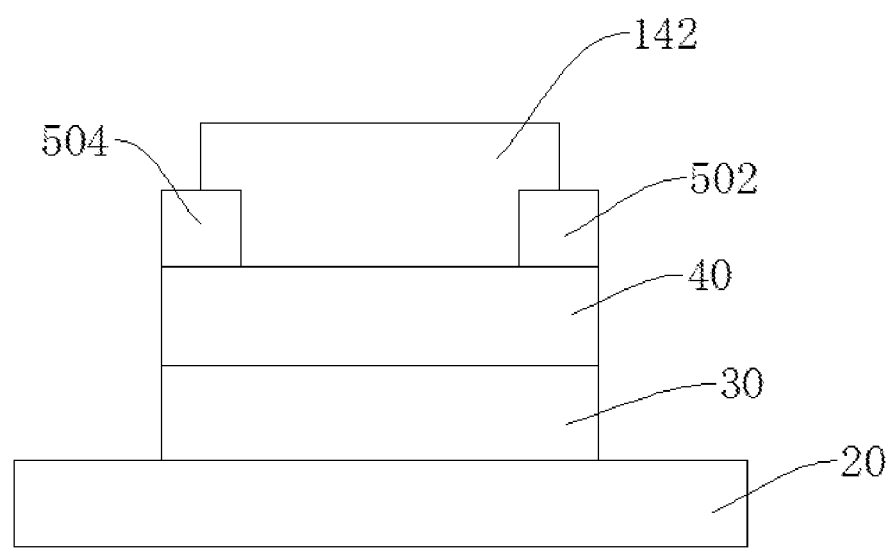
FIG. 5 and FIG. 6 are structure diagrams of the organic thin film transistor made by the manufacturing method of the organic thin film transistor provided by the embodiment of the present application.

In one embodiment, before the organic semiconductor nano line 14 is transferred on the target substrate 20, a gate electrode 30, a gate insulation layer 40, a source electrode 502 and a drain 504, which are sequentially formed and stacked on the target substrate 20. Specifically, the gate electrode 30 is made of a conductive material. The gate insulation layer 40 is an insulation material to insulate the gate electrode 30 and the organic semiconductor layer 142. In one preferred embodiment, the gate insulation layer 40 is made of an organic material to promote the flexibility of the flexible display device. After the organic semiconductor layer 142 is formed on the target substrate 20, the manufactured structure of the organic thin film transistor is shown in FIG. 5. Furthermore, the organic thin film transistor formed in this embodiment is a button contact OTFT. The manufacture process of the button contact OTFT is simple and can partially protect the source 502 and the drain 504.

Figure 6:
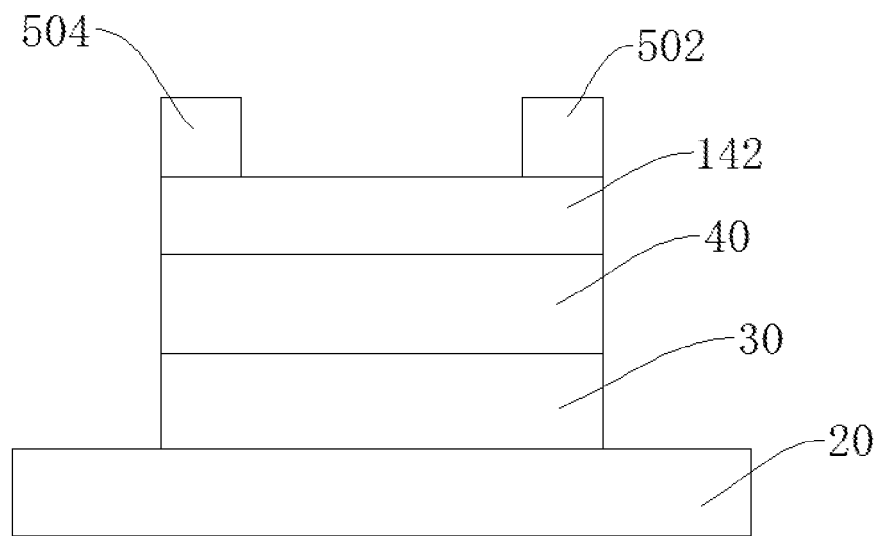

In another embodiment, before the organic semiconductor nano line 14 is transferred on the target substrate 20, a gate electrode 30 and a gate insulation layer 40 are sequentially formed and stacked on the target substrate 20. After the organic semiconductor nano line 14 is transferred on the target substrate 20, a source 502 and a drain 504 are formed on a side of the organic semiconductor nano line 14 away from the gate insulation layer 40. Specifically, the gate electrode 30 is made of a conductive material. The gate insulation layer 40 is an insulation material to insulate the gate electrode 30 and the organic semiconductor layer 142. In one preferred embodiment, the gate insulation layer 40 is made of an organic material to promote the flexibility of the flexible display device. After the organic semiconductor layer 142 is formed on the target substrate 20, the manufactured structure of the organic thin film transistor is shown in FIG. 6. Furthermore, the organic thin film transistor formed in this embodiment is a top contact OTFT. The manufacture process of the top contact OTFT is simple.

In this embodiment, after the organic semiconductor nano line 14 is transferred on the target substrate 20 to form the organic semiconductor layer 142, the organic semiconductor nano line 14 (organic semiconductor layer 142) on the target substrate 20 is etched to form a semiconductor channel. The channel is a conductive layer that is caused by an applied electric field in the length direction in the semiconductor for connecting the source 502 and the drain 504. Furthermore, the designed channel direction is along the length direction of the organic semiconductor nano line 14 to connect the source 502 and the drain 504 at two ends of the organic semiconductor nano line 14.

The graphene layer 12 is formed on the surface of the metal substrate 10 in mass production. The organic semiconductor nano lines 14 (monocrystalline semiconductor) are grown in mass production by graphene layer 12. The semiconductor layer 142 having organic thin film transistors are formed after transferring the organic semiconductor nano lines 14 on the target substrate 20. A large amount of the organic semiconductor nano lines 14 can be formed at a time on the surface of the metal substrate 10 with a large area. The transferring skills of roll-to-roll and roll-to-sheet are mutual and can transfer the organic semiconductor nano lines 14 of the metal substrate 10 on the target substrate 20 in mass production rapidly and with high quality for reducing the consumed time of manufacture process and satisfying the requirement of mass production. The production capacity of display device is high and the production cost is reduced.

The foregoing descriptions are merely the specific embodiments of the present application. However, the present application is not limited thereby. Any modifications, equivalent replacements or improvements within the spirit and principles of the embodiment described above, which can be easily derived by those skilled persons in this art from the technical field disclosed in the present application should be covered by the protected scope of the application. Thus, the patent protection scope of the present application should be subjected to what is claimed is.

What is claimed is:

1. A manufacturing method of an organic thin film transistor, comprising steps of:
   forming a graphene layer on a surface of a metal substrate;
   covering a surface of the graphene layer with an organic solution and heating the graphene layer to form organic semiconductor nano lines on the surface of the graphene layer; and
   transferring the organic semiconductor nano lines to a target substrate;
   wherein the step of forming a graphene layer on a surface of a metal substrate comprises: depositing methane gas and hydrogen by chemical vapor deposition on the surface of the metal substrate at an ambient temperature of not lower than 1000 Celsius degrees, wherein the metal substrate is a copper substrate;
   wherein a plurality of organic semiconductor nano lines form an organic semiconductor nano line set in a transfer printing manner as transferring the organic semiconductor nano lines; and
   wherein the target substrate comprises a gate electrode and a gate insulation layer, which are sequentially stacked; and after the step of transferring the organic semiconductor nano lines to the target substrate, the method further comprises a step of forming a source and a drain on a side of the organic semiconductor nano line away from the gate insulation layer.

2. The manufacturing method of the organic thin film transistor according to claim 1, wherein the transfer printing manner is a roll-to-roll transfer printing or a roll-to-sheet transfer printing.

3. The manufacturing method of the organic thin film transistor according to claim 1, wherein the organic solution is a mixed solution of 9,10-bis-phenylethynylanthracene and dimethylformamide.

4. The manufacturing method of the organic thin film transistor according to claim 1, wherein a temperature of heating the graphene layer is not higher than 50 Celsius degrees and a heating time is not less than 48 hours.

5. The manufacturing method of the organic thin film transistor according to claim 1, wherein after the step of transferring the organic semiconductor nano lines to the target substrate, the method further comprises a step of etching the organic semiconductor nano lines to form a semiconductor channel.

* * * * *